United States Patent
Jia et al.

(10) Patent No.: US 10,756,151 B2
(45) Date of Patent: Aug. 25, 2020

(54) SUBSTRATE AND METHOD OF FABRICATING THE SAME, DISPLAY PANEL, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Wenbin Jia, Beijing (CN); Huifeng Wang, Beijing (CN); Chinlung Liao, Beijing (CN); Feifei Zhu, Beijing (CN); Xiang Wan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 96 days.

(21) Appl. No.: 16/148,799

(22) Filed: Oct. 1, 2018

(65) Prior Publication Data
US 2019/0103452 A1    Apr. 4, 2019

(30) Foreign Application Priority Data
Sep. 30, 2017 (CN) .......................... 2017 1 0915834

(51) Int. Cl.
*H01L 27/32* (2006.01)
*H01L 27/12* (2006.01)

(52) U.S. Cl.
CPC ...... *H01L 27/3258* (2013.01); *H01L 27/1248* (2013.01); *H01L 27/1262* (2013.01); *H01L 2227/323* (2013.01)

(58) Field of Classification Search
CPC ............. H01L 27/3258; H01L 27/1248; H01L 2227/323; H01L 27/1262; H01L 27/3246
See application file for complete search history.

(56) References Cited

U.S. PATENT DOCUMENTS

| 4,799,093 A | 1/1989 | Kohara et al. |
| 2004/0266075 A1 | 12/2004 | Chen |

(Continued)

FOREIGN PATENT DOCUMENTS

| CN | 104810275 A | 7/2015 |
| CN | 105633297 A | 6/2016 |
| TW | 201707088 A | 2/2017 |

OTHER PUBLICATIONS

First Office Action issued in corresponding Chinese Patent Application No. 201710915834.9, dated Sep. 11, 2019, with English translation.

*Primary Examiner* — Stephen W Smoot
*Assistant Examiner* — Vicki B. Booker
(74) *Attorney, Agent, or Firm* — McDermott Will & Emery LLP (57) ABSTRACT

A method of fabricating a substrate includes forming a planarization layer, and forming the planarization layer includes: forming a first planarization sub-layer on a base substrate on which a patterned film layer has been formed. A surface of the first planarization sub-layer facing away from the base substrate has a plurality of depressed portions. Forming the planarization layer further includes: forming a second planarization sub-layer at multiple depressed portions of the plurality of the depressed portions to obtain the planarization layer including the first planarization sub-layer and the second planarization sub-layer. A flatness of a surface of the planarization layer is higher than a flatness of the surface of the first planarization sub-layer.

14 Claims, 4 Drawing Sheets

(56) References Cited

U.S. PATENT DOCUMENTS

2005/0045891 A1\* 3/2005 Yamazaki ......... G02F 1/136227
  257/72
2016/0149156 A1   5/2016 Kim et al.
2018/0076047 A1   3/2018 Tanaka et al.

\* cited by examiner

| Forming a first planarization sub-layer on the base substrate on which the patterned film layer has been formed. A surface of the first planarization sub-layer facing away from the base substrate has a plurality of depressed portions | — S100 |

↓

| Forming a second planarization sub-layer at multiple depressed portions of the plurality of depressed portions to obtain a planarization layer that includes a first planarization sub-layer and a second planarization sub-layer. A flatness of a surface of the planarization layer is higher than a flatness of the surface of the first sub-planarization layer facing away from the base substrate | — S101 |

SUBSTRATE AND METHOD OF FABRICATING THE SAME, DISPLAY PANEL, AND DISPLAY DEVICE

CROSS-REFERENCE TO RELATED APPLICATION

This application claims priority to Chinese Patent Application No. 201710915834.9, filed on Sep. 30, 2017, titled "A SUBSTRATE AND METHOD OF FABRICATING THE SAME, DISPLAY PANEL, AND DISPLAY DEVICE", which is incorporated herein by reference in its entirety.

TECHNICAL FIELD

The present disclosure relates to the field of display technologies, and more particularly, to a substrate and a method of fabricating the same, a display panel, and a display device.

BACKGROUND

At present, with the rapid development of science and technology, various kinds of display devices have emerged, for example, liquid crystal display (LCD) devices and organic light-emitting diode (OLED) display devices.

SUMMARY

In an aspect, a method of fabricating a substrate is provided, and the method includes forming a planarization layer. Forming the planarization layer includes: forming a first planarization sub-layer on a base substrate on which a patterned film layer has been formed. A surface of the first planarization sub-layer facing away from the base substrate has a plurality of depressed portions. Forming the planarization layer further includes: forming a second planarization sub-layer at at least multiple depressed portions of the plurality of depressed portions to obtain the planarization layer including the first planarization sub-layer and the second planarization sub-layer. A flatness of a surface of the planarization layer is higher than a flatness of the surface of the first planarization sub-layer facing away from the substrate.

In some embodiments, forming the first planarization sub-layer on the base substrate on which the patterned film layer has been formed includes forming a first planarization sub-film on the base substrate on which a patterned film layer has been formed, and performing a drying process on the first planarization sub-film to form the first planarization sub-layer. The first planarization sub-film includes a material forming the first planarization sub-layer and a solvent.

In some embodiments, forming the second planarization sub-layer at the at least multiple depressed portions of the plurality of depressed portions includes forming a second planarization sub-film at the at least multiple depressed portions of the plurality of depressed portions, and performing a drying process on the second planarization sub-film to form the second planarization sub-layer. The second planarization sub-film includes a material forming the second planarization sub-layer and a solvent.

In some embodiments, after forming the first planarization sub-layer and before forming the second planarization sub-layer at the at least multiple depressed portions of the plurality of depressed portions, the method of fabricating the substrate further includes treating the surface of the first planarization sub-layer facing away from the base substrate to make the surface of the first planarization sub-layer hydrophilic. A material of the second planarization sub-layer is a hydrophilic material.

In some embodiments, after forming the first planarization sub-layer and before forming the second planarization sub-layer at the at least multiple depressed portions of the plurality of depressed portions, the method of fabricating the substrate further includes treating the surface of the first planarization sub-layer facing away from the base substrate to make the surface of the first planarization sub-layer hydrophobic. A material of the second planarization sub-layer is a hydrophobic material.

In some embodiments, a thickness of the second planarization sub-film is greater than a depth of each of the at least multiple depressed portions of the plurality of depressed portions.

In some embodiments, after forming the first planarization sub-layer and before forming the second planarization sub-layer at the at least multiple depressed portions of the plurality of depressed portions, the method of fabricating the substrate further includes determining a thickness of a portion of the second planarization sub-film to be filled into each of the at least multiple depressed portions of the plurality of depressed portions according to depths of at least two of the at least multiple depressed portions and a shrinkage ratio of the second planarization sub-film.

In some embodiments, forming the second planarization sub-film at the at least multiple depressed portions of the plurality of depressed portions includes printing the second planarization sub-film at the at least multiple depressed portions of the plurality of depressed portions.

In some embodiments, a material of the first planarization sub-layer is the same as a material of the second planarization sub-layer.

In some embodiments, the substrate includes a display area and a non-display area. Forming the second planarization sub-layer at the at least multiple depressed portions of the plurality of depressed portions includes forming the second planarization sub-layer at some of the plurality of depressed portions located in the display area of the substrate.

In another aspect, a substrate is provided, and the substrate includes a base substrate, a patterned film layer disposed on the base substrate, and a planarization layer disposed on the patterned film layer. The planarization layer includes a first planarization sub-layer and a second planarization sub-layer. A surface of the first planarization sub-layer facing away from the base substrate has a plurality of depressed portions, and the second planarization sub-layer is disposed at the at least multiple depressed portions of the plurality of depressed portions. A flatness of a surface of the planarization layer is higher than a flatness of the surface of the first planarization sub-layer facing away from the base substrate.

In some embodiments, a material of the first planarization sub-layer is the same as a material of the second planarization sub-layer.

In some embodiments, the patterned film layer includes a plurality of thin film transistors.

In some embodiments, the substrate further includes a plurality of light-emitting devices sequentially disposed on the planarization layer, and each light-emitting device includes a first electrode, a light-emitting functional layer and a second electrode.

In yet another aspect, a display panel is provided, and the display panel includes the substrate described above.

In yet another aspect, a display device is provided, and the display device includes the display panel described above.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

A planarization layer is usually formed in manufacturing processes of LCD devices and OLED display devices. If a flatness of the planarization layer is not high enough, one or more pixels are prone to unevenness, which will seriously affect the performance of the display device.

Taking OLED display devices as an example, a film formation method of organic light-emitting devices mainly includes a solution process. In the solution process, a film is formed by inkjet printing, nozzle coating, spin coating or screen printing. The solution process is characterized by free flow of droplets, which requires higher flatness of the planarization layer. Since a flatness of the planarization layer has a great impact on a distribution of droplets, it will affect a thickness uniformity of the film in organic light-emitting devices. The thickness uniformity of the film in organic light-emitting devices will in turn affect a uniformity of light emitted by the organic light-emitting devices, and a service life and efficiency of the organic light-emitting devices. Especially for top-emitting devices, if a pixel electrode is not flat enough, the uniformity of light and device performance will be seriously affected.

Figure 1A:
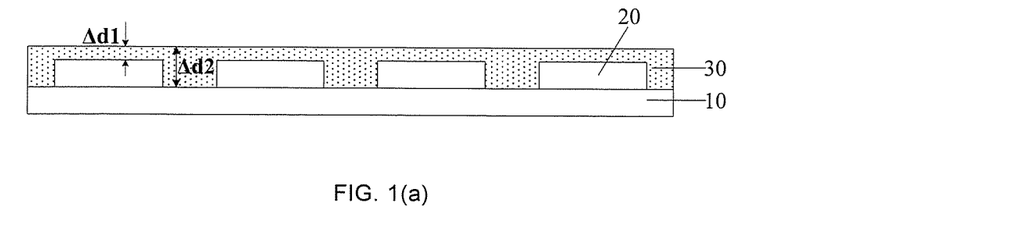
FIG. 1(a) is a schematic diagram showing a structure obtained after a planarization layer is formed on a base substrate on which a patterned film layer has been formed and before the planarization layer is dried in the related art.
Figure 1B:
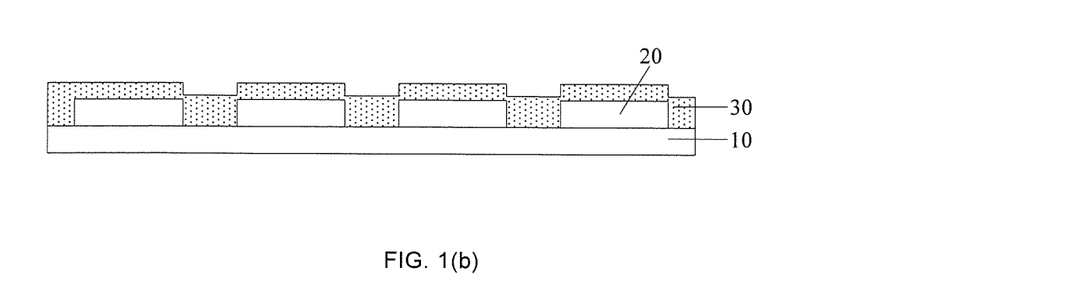
FIG. 1(b) is a schematic diagram showing a structure obtained after the planarization layer is dried on the basis of FIG. 1(a)

The planarization layer of OLED display devices are prone to unevenness mainly because: as shown in FIG. 1(a), a surface of a patterned film layer 20 formed on a base substrate 10 is uneven (for example, a position of a thin film transistor may be slightly higher than other positions). As a result, when forming the planarization layer 30 on the patterned film layer 20, a thickness of the planarization layer 30 is different at different positions (for example, $\Delta d1$ and $\Delta d2$ in FIG. 1(a)). When the thickness of the planarization layer 30 is different at different positions, a corresponding shrinkage ratio is also different during a drying process. Generally, a shrinkage ratio of a region of the planarization layer 30 corresponding to a recessed portion between two adjacent blocks of the patterned film layer 20 is larger than a shrinkage ratio of a region of the planarization layer 30 corresponding to a block of the patterned film layer 20. Based on this, as shown in FIG. 1(a), the planarization layer 30 has been leveled before drying; but after the drying process, as shown in FIG. 1(b), depressed portions will appear again in a region between two adjacent blocks of the patterned film layer 20, which causes the formed planarization layer 30 to be uneven.

Some embodiments of the present disclosure provide a method of fabricating a substrate, which includes forming a planarization layer.

Figure 2:
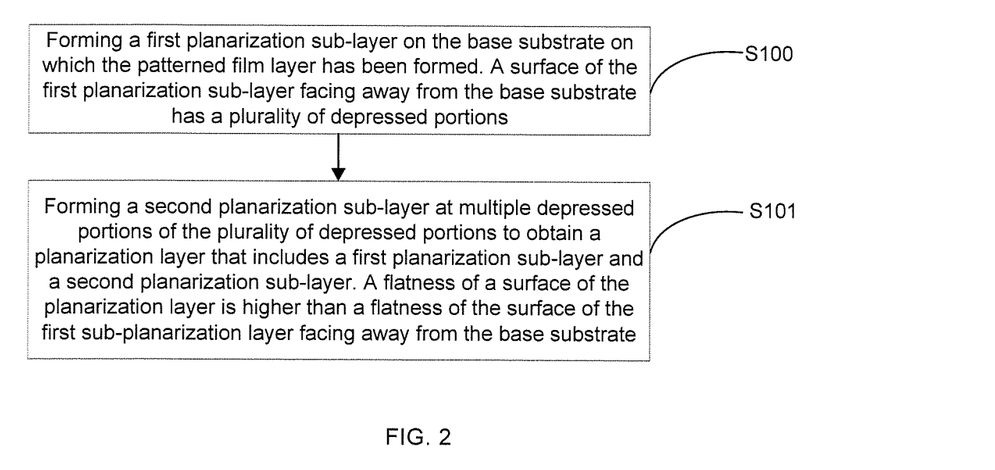
FIG. 2 is a schematic flow chart of a method of fabricating a substrate according to some embodiments of the present disclosure.
Figure 3A:
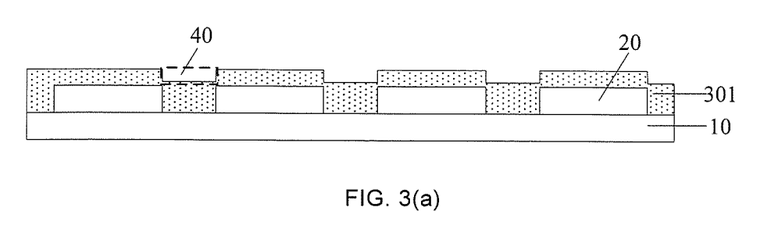
FIG. 3(a) is a schematic diagram showing a structure obtained after a first planarization sub-layer is formed on a base substrate on which a patterned film layer has been formed according to some embodiments of the present disclosure.

Forming the planarization layer, as shown in FIG. 2, includes:

S100, forming a first planarization sub-layer 301 on the base substrate 10 on which the patterned film layer 20 has been formed. A surface of the first planarization sub-layer 301 facing away from the base substrate 10 has a plurality of depressed portions 40, as shown in FIG. 3(a).

In some embodiments, the patterned film layer 20 is any film layer formed on the base substrate 10, for example, a single film layer or a film layer including a plurality of film sub-layers. In some embodiments, the patterned film layer 20 includes a plurality of film sub-layers constituting a thin film transistor.

It will be noted that a material of the base substrate 10 is not limited herein. For example, the base substrate 10 is a glass substrate.

The first planarization sub-layer 301 is thick enough to fill up each depressed portion between two adjacent blocks of the patterned film layer 20. Since a surface of the patterned film layer 20 is uneven, when forming the first planarization sub-layer 301 on the patterned film layer 20, a region of the first planarization sub-layer 301 corresponding to a depressed portion between two adjacent blocks of the patterned film layer 20 has a larger shrinkage ratio than a region of the first planarization sub-layer 301 corresponding to a block of the patterned film layer 20 during the drying process. As a result, regions of the first planarization sub-layer 301 corresponding to a plurality of depressed portions, each of which is disposed between two adjacent blocks of the patterned film layer 20, become depressed again, forming the plurality of depressed portions 40.

Furthermore, a material of the first planarization sub-layer 301 is not limited herein. In some embodiments, the material of the first planarization sub-layer 301 includes a resin.

Figure 3B:
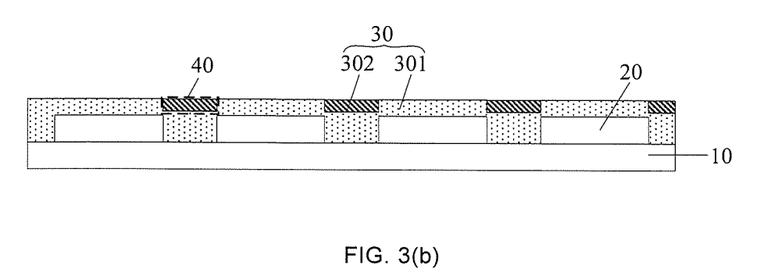
FIG. 3(b) is a schematic diagram showing a structure obtained after a second planarization sub-layer is formed at depressed portions of a first planarization sub-layer according to some embodiments of the present disclosure.

Forming the planarization layer, as shown in FIG. 2, further includes S101, forming a second planarization sub-layer 302 at at least multiple of the plurality of depressed portions 40 to obtain the planarization layer 30 that includes the first planarization sub-layer 301 and the second planarization sub-layer 302, as shown in FIG. 3(b). A flatness of a surface of the planarization layer 30 is higher than a flatness of the surface of the first planarization sub-layer 301 facing away from the base substrate 10.

For example, forming a second planarization sub-layer 302 at at least multiple of the plurality of depressed portions 40 refers to that forming a plurality of first planarization portions each of which is formed within a corresponding one of the at least multiple of the plurality of depressed portions 40. That is, the second planarization sub-layer 302 includes the plurality of first planarization portions.

Since a surface of an object is not absolutely flat, the flatness is measured by a deviation in a thickness of the object in a direction perpendicular to the surface of the object. The smaller the deviation in a distance between the surface of the object and a same horizontal plane in a direction perpendicular to the surface, the flatter the surface of the object.

Based on this, the description "a flatness of the surface of the planarization layer 30 is higher than a flatness of the surface of the first planarization sub-layer 301 facing away from the base substrate 10" can be understood in the following way: a deviation in a distance between the surface of the planarization layer 30 and a same horizontal plane in a direction perpendicular to the surface of the planarization layer 30 is smaller than a deviation in a distance between the surface of the first planarization sub-layer 301 facing away from the base substrate 10 and a same horizontal plane in a direction perpendicular to the surface of the first planarization sub-layer 301. That is, the surface of the planarization layer 30 is flatter than the surface of the first planarization sub-layer 301 facing away from the base substrate 10.

Figure 4:
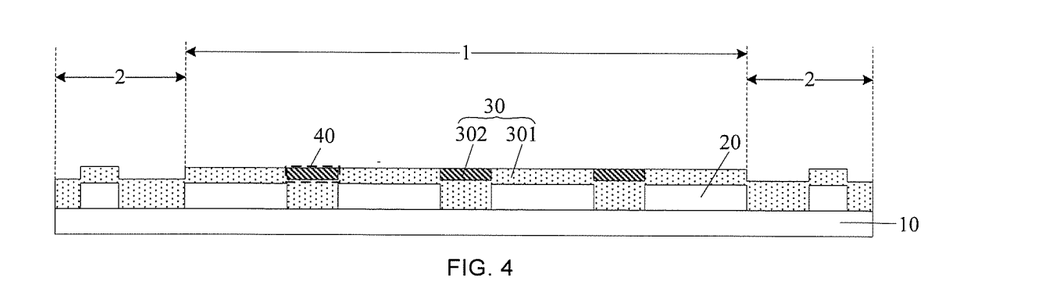
FIG. 4 is a schematic diagram showing another structure obtained after a second planarization sub-layer is formed at depressed portions of a first planarization sub-layer according to some embodiments of the present disclosure.

In some embodiments, as shown in FIG. 4, the substrate includes a display area 1 and a non-display area 2. Based on this, forming the second planarization sub-layer 302 at the at least multiple of the plurality of depressed portions 40 includes forming the second planarization sub-layer 302 only at some of the plurality of depressed portions 40 of the first planarization sub-layer 301 located in the display area 1 of the substrate. Since the non-display area 2 is not used for displaying, no light-emitting devices are provided in this area. Therefore, it is technically easier to form the second planarization sub-layer 302 only at the depressed portions 40 located in the display area 1.

In some other embodiments, the substrate includes a display area 1 and a non-display area 2. Based on this, forming the second planarization sub-layer 302 at the at least multiple of the plurality of depressed portions 40 includes forming a second planarization sub-layer 302 at the plurality of depressed portions 40 of the first planarization sub-layer 301 located in both the display area 1 and the non-display area 2 of the substrate.

It will be noted that a material of the second planarization sub-layer 302 is not limited herein. For example, the material of the second planarization sub-layer 302 is a resin.

In some embodiments, the material of the first planarization sub-layer 301 is the same as the material of the second planarization sub-layer 302. Since the first planarization sub-layer 301 and the second planarization sub-layer 302 can be better joined when the material of the first planarization sub-layer 301 is the same as the material of the second planarization sub-layer 302, the problem that a gap may be formed at a position where the first planarization sub-layer 301 and the second planarization sub-layer 302 are not in full contact may be avoided.

In some other embodiments, the material of the first planarization sub-layer 301 is different from the material of the second planarization sub-layer 302. In this case, in some embodiments, the material of the first planarization sub-layer 301 and the material of the second planarization sub-layer 302 have the same hydrophilicity or hydrophobicity (e.g., both hydrophilic or hydrophobic).

In addition, it will be noted that the method of forming the second planarization sub-layer 302 at the at least multiple depressed portions of the plurality of depressed portions 40 of the first planarization sub-layer 301 is not limited, as long as the second planarization sub-layer 302 can be formed at the at least multiple depressed portions of the plurality of depressed portions 40 of the first planarization sub-layer 301.

In the method of fabricating the substrate provided in the embodiments of the present disclosure, since after the first planarization sub-layer 301 is formed on the base substrate 10 on which the patterned film layer 20 has been formed, the second planarization sub-layer 302 is further formed at the at least multiple depressed portions of the plurality of depressed portions 40 of the first planarization sub-layer 301, the second planarization sub-layer 302 can fill up each of the at least multiple depressed portions of the plurality of depressed portions 40 of the first planarization sub-layer 301. Therefore, the flatness of the surface of the planarization layer 30 composed of the first planarization sub-layer 301 and the second planarization sub-layer 302 is higher than the flatness of the surface of the first planarization sub-layer 301 facing away from the base substrate 10. Therefore, the flatness of the planarization layer 30 is improved. That is to say, formation of the second planarization sub-layer 302 makes a surface of the formed planarization layer 30 facing away from the base substrate 10 flatter.

Figure 5:
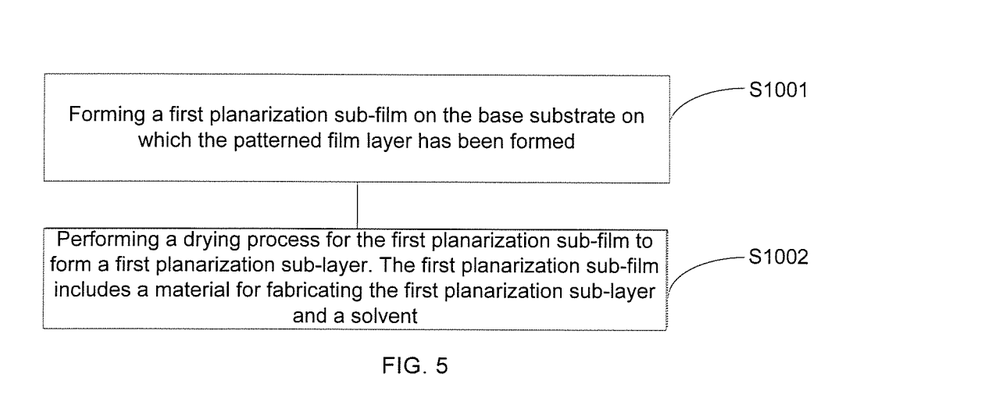
FIG. 5 is a schematic flow chart of a method of forming a first planarization sub-layer according to some embodiments of the present disclosure.
Figure 6A:
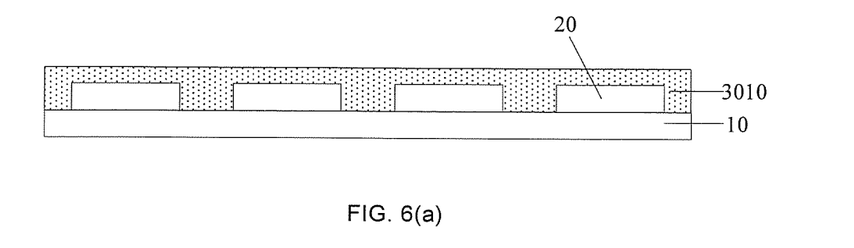
FIG. 6(a) is a schematic diagram showing a structure obtained after a first planarization sub-film is formed according to some embodiments of the present disclosure.

In some embodiments, S100, forming the first planarization sub-layer 301 on the base substrate 10 on which the patterned film layer 20 has been formed, as shown in FIG. 5, includes: S1001, forming a first planarization sub-film 3010 on the base substrate 10 on which the patterned film layer 20 has been formed, as shown in FIG. 6(a); and S1002, performing a drying process on the first planarization sub-film 3010 to form the first planarization sub-layer 301, as shown in FIG. 3(a). The first planarization sub-film 3010 includes a material forming the first planarization sub-layer and a solvent.

In some embodiments, the first planarization sub-film 3010 is dried after the first planarization sub-film 3010 is formed on the base substrate 10 on which the patterned film layer 20 has been formed and after the first planarization sub-film 3010 is leveled. Since the first planarization sub-film 3010 includes the material forming the first planarization sub-layer and the solvent, during the drying process, the solvent in the first planarization sub-film 3010 evaporates and the material forming the first planarization sub-layer is left behind, thereby forming the first planarization sub-layer 301.

In some embodiments, during the process of drying the first planarization sub-film 3010, the first planarization sub-film 3010 is dried under vacuum.

In some other embodiments, in order to improve the quality of the formed first planarization layer 301, during the process of drying the first planarization sub-film 3010, the first planarization sub-film 3010 is cooled under vacuum. Based on this, in some embodiments, a vacuum cooling dryer (VCD) is used to perform vacuum cooling and vacuum drying on the first planarization sub-film 3010.

In some embodiments, the first planarization sub-film 3010 is formed on the base substrate 10 on which the patterned film layer 20 has been formed by a method such as slit coating, spin coating, or spray coating.

Figure 6B:
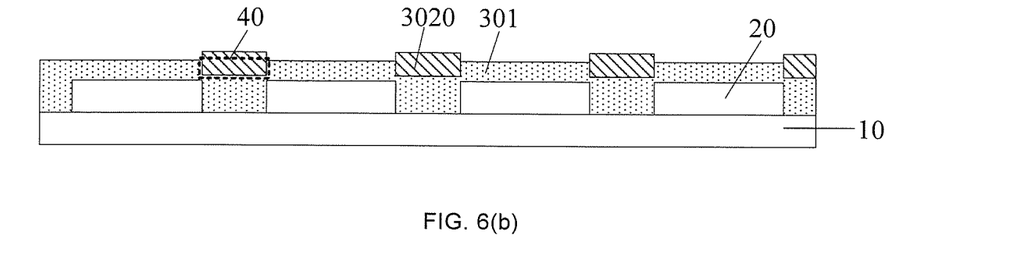
FIG. 6(b) is a schematic diagram showing a structure obtained after a second planarization sub-film is formed at depressed portions of a first planarization sub-layer according to some embodiments of the present disclosure.
Figure 7:
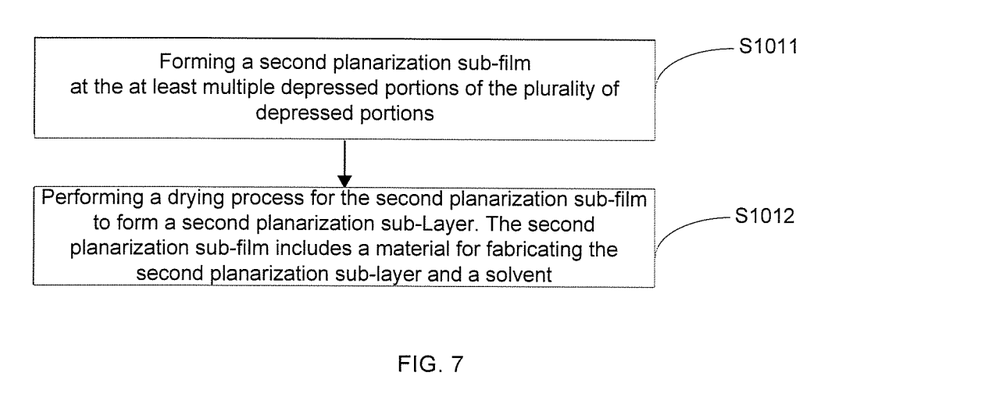
FIG. 7 is a schematic flow chart of a method of forming a second planarization sub-layer according to some embodiments of the present disclosure.

In some embodiments, S101, forming the second planarization sub-layer 302 at the at least multiple depressed portions of the plurality of depressed portions 40, as shown in FIG. 7, includes: S1011, forming a second planarization sub-film 3020 at the at least multiple depressed portions of the plurality of depressed portions 40, as shown in FIG. 6(b); and S1012, performing a drying process for the second planarization sub-film 3020 to form the second planarization sub-layer 302 as shown in FIG. 3(b). The second planarization sub-film 3020 includes a material forming the second planarization sub-layer and a solvent.

Since the solvent in the second planarization sub-film 3020 will evaporate, when performing a drying process on the second planarization sub-film 3020, the second planarization sub-film 3020 will shrink.

Based on this, in order to increase the flatness of the planarization layer 30 composed of the first planarization sub-layer 301 and the second planarization sub-layer 302 as much as possible, in some embodiments, a thickness of the second planarization sub-film 3020 is larger than a depth of each of the at least multiple depressed portions of the plurality of depressed portions 40 (a distance between a bottom surface of the depressed structure and a top of the depressed structure of the first planarization sub-layer 301, that is, a gap value). Thus, the flatness of the planarization layer 30 composed of the first planarization sub-layer 301 and the second planarization sub-layer 302 formed after shrinkage of the second planarization sub-film 3020 during the drying process is higher.

In some embodiments, the second planarization sub-film includes a plurality of second planarization portions, and each second planarization portion corresponds to a corresponding depressed portion, that is, each second planarization portion is disposed within a corresponding depressed portion. In addition, for each of the at least multiple depressed portions of the plurality of depressed portions 40, a thickness of a second planarization portion formed within the depressed portion is larger than a depth of the depressed portion.

As for the thickness of the second planarization sub-film 3020, the second planarization sub-film 3020 is thick enough as long as the planarization layer 30 composed of the second planarization sub-layer 302 and the first planarization sub-layer 301 is flat. In some embodiments, the thickness of the second planarization sub-film 3020 is 5%-10% larger than the depth of each of the at least multiple depressed portions of the plurality of depressed portions, so that the surface of the planarization layer 30 composed of the first planarization sub-layer 301 and the second planarization sub-layer 302 formed after shrinkage of the second planarization sub-film 3020 during the drying process is flatter.

In some other embodiments, the thickness of the second planarization sub-film 3020 is determined according to a shrinkage ratio of the second planarization sub-film 3020 and the depth of each of the at least multiple depressed portions of the plurality of depressed portions 40.

In some embodiments, the second planarization sub-film 3020 is formed in the same manner as the first planarization sub-film 3010, or in other manners. In some embodiments, due to a high precision of a printing method, forming the second planarization sub-film 3020 at the at least multiple depressed portions of the plurality of depressed portions 40 includes printing the second planarization sub-film 3020 at the at least multiple depressed portions of the plurality of depressed portions 40. In this way, the problem that the second planarization sub-film 3020 may be formed in places other than at the at least multiple depressed portions of the plurality of depressed portions 40 may be avoided. It will be understood that a position of each of the at least multiple depressed portions of the plurality of depressed portions shall be determined before printing the second planarization sub-film 3020 using the printing method.

In some embodiments, the second planarization sub-film 3020 is dried under vacuum.

In some other embodiments, in order to improve the quality of the formed second planarization sub-layer 302, the second planarization sub-film 3020 is cooled under vacuum. Based on this, in some embodiments, a VCD is used to perform vacuum cooling and vacuum drying for the second planarization sub-film 3020.

In some embodiments, after forming the first planarization sub-layer 301 and before forming the second planarization sub-layer 302 at the at least multiple depressed portions of the plurality of depressed portions, the method of fabricating the substrate further includes treating the surface of the first planarization sub-layer 301 to make the surface of the first planarization sub-layer hydrophilic. In addition, a material of the second planarization sub-layer 302 is a hydrophilic material.

In some other embodiments, after forming the first planarization sub-layer 301 and before forming the second planarization sub-layer 302 at the at least multiple depressed portions of the plurality of depressed portions 40, the method of fabricating the substrate further includes treating the surface of the first planarization sub-layer 301 to make the surface of the first planarization sub-layer 301 hydrophobic. In addition, a material of the second planarization sub-layer 302 is a hydrophobic material.

According to the principle of "like dissolves like", materials of the same polarity are more easily attracted to each other, and materials of opposite polarity are more likely to be mutually exclusive. Based on this, when the material of the first planarization sub-layer 301 and the material of the second planarization sub-layer 302 are both hydrophilic or both hydrophobic, the first planarization sub-layer 301 and the second planarization sub-layer 302 have enhanced adhesion.

In a case where the surface of the first planarization sub-layer 301 is hydrophilic after treatment and the material of the second planarization sub-layer 302 is a hydrophilic material, when forming the second planarization sub-layer 302 at the at least multiple depressed portions of the plurality of depressed portions 40 of the first planarization sub-layer 301, the material forming the second planarization sub-layer 302 will quickly spread and be leveled at each of the at least multiple depressed portions 40.

Similarly, in a case where the surface of the first planarization sub-layer 301 is hydrophobic after treatment and the material of the second planarization sub-layer 301 is a hydrophobic material, when forming the second planarization sub-layer 302 at the at least multiple depressed portions of the plurality of depressed portions 40 of the first planarization sub-layer 301, the material forming the second planarization sub-layer 302 will quickly spread and be leveled at each of the at least multiple depressed portions 40.

In some embodiments, after forming the first planarization sub-layer 301 and before forming the second planarization sub-film 3020 at the at least multiple depressed portions of the plurality of depressed portions 40, the method of fabricating the substrate further includes determining a thickness of a portion of the second planarization sub-film 3020 to be filled into each of the at least multiple depressed portions of the plurality of depressed portions 40 according to depths of at least two of the at least multiple depressed portions 40 and a shrinkage ratio of the second planarization sub-film 3020.

How to measure the depths of the at least two of the at least multiple depressed portions of the plurality of depressed portions 40 is not limited herein. For example, the depths of the depressed portions 40 are measured by using a white light interferometer or a charge coupled device (CCD) image sensor. Furthermore, the white light interferometer or CCD image sensor may also be used to determine positions of the at least two of the at least multiple depressed portions of the plurality of depressed portions 40.

The shrinkage ratio refers to the ratio of the volume of the material before drying to the volume of the material after drying. When a composition of the material is determined, the shrinkage ratio of the material is also determined.

In some embodiments, the depth of each of the at least multiple depressed portions of the plurality of depressed portions 40 of the first planarization sub-layer 301 is detected, and the thickness of a portion of the second planarization sub-film 3020 filled into each of the multiple depressed portions of the plurality of depressed portions is determined according to the depth of each of the at least multiple depressed portions 40 and the shrinkage ratio of the second planarization sub-film 3020.

In some other embodiments, several depressed portions (i.e., at least two depressed portions) out of the at least multiple depressed portions of the plurality of depressed portions 40 in a specific area of the first planarization sub-layer 301 (for example, a middle area of the substrate) are selected, depths of the several depressed portions are detected, and an average value of the depths of the several depressed portions is calculated. The thickness of the portion of the second planarization sub-film 3020 to be filled into each of the at least multiple depressed portions 40 is determined according to the average value of the depths of the several depressed portions and the shrinkage ratio of the second planarization sub-film 3020.

Since the depths of the at least multiple depressed portions of the plurality of depressed portions 40 of the first planarization sub-layer 301 and the shrinkage ratio of the second planarization sub-film 3020 affect a ratio of shrinkage of the second planarization sub-film 3020 after the drying process, after the first planarization sub-layer 301 is formed and before forming the second planarization sub-film 3020 at the at least multiple depressed portions of the plurality of depressed portions 40, the thickness of the portion of the second planarization sub-film 3020 to be filled into each of the at least multiple depressed portions 40 is determined according to the depths of the at least two of the at least multiple depressed portions 40 and the shrinkage ratio of the second planarization sub-film 3020. In this way, the thickness of the second planarization sub-layer 302 may be precisely controlled, thereby ensuring that the planarization layer 30 composed of the first planarization sub-layer 301 and the second planarization sub-layer 302 is flat and further improving the flatness of the planarization layer 30.

Some embodiments of the present disclosure provide a substrate. As shown in FIG. 3(b), the substrate includes a base substrate 10, a patterned film layer 20 disposed on the base substrate 10, and a planarization layer 30 disposed on the patterned film layer 20. The planarization layer 30 includes a first planarization sub-layer 301 and a second planarization sub-layer 302. A surface of the first planarization sub-layer 301 facing away from the base substrate 10 has a plurality of depressed portions 40, and the second planarization sub-layer 302 is disposed at at least multiple depressed portions of the plurality of depressed portions 40. A flatness of the surface of the planarization layer 30 is higher than a flatness of the surface of the first planarization sub-layer 301 facing away from the base substrate 10.

Figure 8:
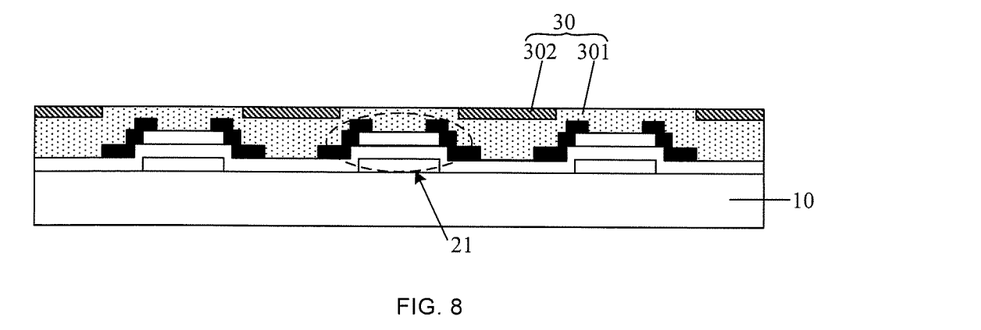
FIG. 8 is a schematic diagram showing a structure of a substrate according to some embodiments of the present disclosure.

In some embodiments, the patterned film layer 20 is any film layer formed on the base substrate 10, for example, a single film layer, or a film layer including a plurality of film sub-layers. In some embodiments, as shown in FIG. 8, the patterned film layer 20 includes a plurality of film sub-layers constituting a thin film transistor 21.

A material of the first planarization sub-layer 301 and a material of the second planarization sub-layer 302 are not limited herein. In some embodiments, the material of the first planarization sub-layer 301 and the material of the second planarization sub-layer 302 are resins.

In some embodiments, the material of the first planarization sub-layer 301 is the same as the material of the second planarization sub-layer 302. In some other embodiments, the material of the first planarization sub-layer 301 is different from the material of the second planarization sub-layer 302.

In a case where the material of the first planarization sub-layer 301 is the same as the material of the second planarization sub-layer 302, the first planarization sub-layer 301 and the second planarization sub-layer 302 may be better attracted to each other, ensuring that the first planarization sub-layer 301 and the second planarization sub-layer 302 are in full contact and there is no gaps therebetween. It will be noted that since the second planarization sub-layer 302 is disposed at the at least multiple depressed portions of the plurality of depressed portions 40, the first planarization sub-layer 301 is formed before the second planarization sub-layer 302 is formed during the manufacturing process of the substrate.

In some embodiments, the substrate is a substrate in an LCD device, or a substrate in an OLED display device, which is not limited herein.

In some embodiments, as shown in FIG. 4, the substrate includes a display area 1 and a non-display area 2. Based on this, the second planarization sub-layer 302 is only disposed at some of the plurality of depressed portions 40 of the first planarization sub-layer 301 located in the display area 1 of the substrate. Since the non-display area 2 is not used for displaying, no light-emitting devices are provided in this area. Therefore, it is technically easier to form the second planarization sub-layer 302 only at the multiple depressed portions 40 in the display area 1.

In some other embodiments, the substrate includes a display area 1 and a non-display area 2, and the second planarization sub-layer 302 is disposed at the plurality of depressed portions 40 of the first planarization sub-layer 301 located in both the display area 1 and the non-display area 2 of the substrate.

In the substrate provided by the embodiments of the present disclosure, since the planarization layer 30 of the substrate includes the first planarization sub-layer 301 and the second planarization sub-layer 302, and the second planarization sub-layer 302 is disposed at the at least multiple depressed portions of the plurality of depressed portions 40 of the first planarization sub-layer 301, the second planarization sub-layer 302 may fill up the at least multiple depressed portions of the plurality of depressed portions 40 of the first planarization sub-layer 301. As a result, the flatness of the surface of the planarization layer 30 composed of the first planarization sub-layer 301 and the second planarization sub-layer 302 is higher than a flatness of the surface of the first planarization sub-layer 301 facing away from the base substrate 10, which means the flatness of the planarization layer 30 is improved.

Figure 9:
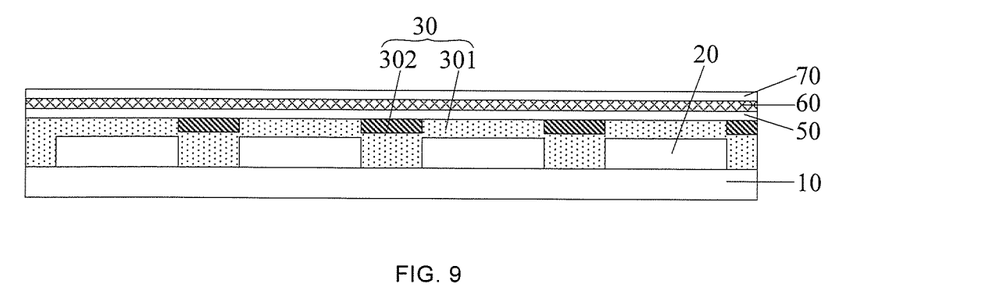
FIG. 9 is a schematic diagram showing a structure of another substrate according to some embodiments of the present disclosure.

In some embodiments, as shown in FIG. 9, the substrate further includes a plurality of light-emitting devices sequentially disposed on the planarization layer 30, and each light-emitting device includes a first electrode 50, a light-emitting functional layer 60, and a second electrode 70.

In some embodiments, the first electrode 50 is an anode electrode and the second electrode 70 is a cathode electrode. In some other embodiments, the first electrode 50 is a cathode electrode and the second electrode 70 is an anode electrode.

In some embodiments, the light-emitting functional layer 60 only includes a light-emitting layer. In some other embodiments, the light-emitting functional layer 60 includes at least one of a hole transport layer, an electron transport layer, a hole injection layer, and an electron injection layer in addition to the light-emitting layer.

Since on the base substrate, the flatness of the surface of the planarization layer 30 composed of the first planarization sub-layer 301 and the second planarization sub-layer 302 is higher than the flatness of the surface of the first planarization sub-layer 301 facing away from the base substrate 10, when forming the first electrode 50, the light-emitting functional layer 60, and the second electrode 70 on the planarization layer 30 by a solution process, uniformities of the formed film layers may be ensured.

Some embodiments of the present disclosure provide a display panel, which includes the substrate described above.

The display panel is for example an LCD panel or an OLED panel, which is not limited in the present disclosure.

In some embodiments, the substrate is an array substrate in the display panel. In some other embodiments, the substrate is an assembling substrate assembled with the array substrate.

In the display panel provided by the embodiments of the present disclosure, since the display panel includes the substrate described above, and the planarization layer 30 of the substrate includes the first planarization sub-layer 301 and the second planarization sub-layer 302, the flatness of the planarization layer 30 composed of the first planarization sub-layer 301 and the second planarization sub-layer 302 is higher than the flatness of the surface of the first planarization sub-layer 301 facing away from the base substrate 10. In this way, when forming other film layers on the planarization layer 30, uniformities of other film layers are ensured, thereby ensuring a uniformity of light emitted from the display panel.

Some embodiments of the present disclosure provide a display device, which includes the display panel described above.

In some embodiments, the display device is any device that displays an image whether the image is moving (e.g., a video) or fixed (e.g., a still image), and whether it is a text or a picture. For example, the display device is implemented in or associated with a plurality of electronic devices. The plurality of electronic devices are (but not limited to), for example, mobile phones, wireless devices, personal data assistants (PDA), handheld or portable computers, GPS receivers/navigators, cameras, MP4 video players, video cameras, game consoles, watches, clocks, calculators, TV monitors, flat panel displays, computer monitors, car displays (e.g., odometer displays), navigators, cockpit controls and/or displays, displays of camera views (e.g., displays of rear view cameras in vehicles), electronic photo frames, electronic billboards or signs, projectors, architectural structures, and packaging and aesthetic structures (e.g., displays for an image of a piece of jewelry), etc.

In the display device provided by the embodiments of the present disclosure, since the display device includes the substrate described above, and the planarization layer 30 of the substrate includes the first planarization sub-layer 301 and the second planarization sub-layer 302, the flatness of the surface of the planarization layer 30 composed of the first planarization sub-layer 301 and the second planarization sub-layer 302 is higher than the flatness of the surface of the first planarization sub-layer 301 facing away from the base substrate 10. In this way, when other film layers are formed on the planarization layer 30, the uniformities of other film layers are ensured, thereby ensuring a uniformity of light emitted from the display device.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be at the protection scope of the present disclosure. Therefore, the protection scope of the present disclosure shall be subject to the protection scope of the claims.

What is claimed is:
1. A method of fabricating a substrate, comprising:
  forming a planarization layer, wherein
  forming the planarization layer comprises:
  forming a first planarization sub-layer on a base substrate on which a patterned film layer has been formed, a surface of the first planarization sub-layer facing away from the base substrate having a plurality of depressed portions; and
  forming a second planarization sub-layer at least multiple depressed portions of the plurality of depressed portions to obtain the planarization layer comprising the first planarization sub-layer and the second planarization sub-layer, a flatness of a surface of the planarization layer being higher than a flatness of the surface of the first planarization sub-layer facing away from the base substrate, wherein
  after forming the first planarization sub-layer and before forming the second planarization sub-layer at the at least multiple depressed portions of the plurality of depressed portions, the method further comprises:

treating the surface of the first planarization sub-layer facing away from the base substrate to make the surface of the first planarization sub-layer hydrophilic, a material of the second planarization sub-layer being a hydrophilic material, or treating the surface of the first planarization sub-layer facing away from the base substrate to make the surface of the first planarization sub-layer hydrophobic, the material of the second planarization sub-layer being a hydrophobic material.

2. The method of fabricating the substrate according to claim 1, wherein forming the first planarization sub-layer on the base substrate on which the patterned film layer has been formed comprises:

forming a first planarization sub-film on the base substrate on which the patterned film layer has been formed; and performing a drying process on the first planarization sub-film to form the first planarization sub-layer, the first planarization sub-film comprising a material forming the first planarization sub- layer and a solvent.

3. The method of fabricating the substrate according to claim 1, wherein forming the second planarization sub-layer at the at least multiple depressed portions of the plurality of depressed portions comprises:

forming a second planarization sub-film at the at least multiple depressed portions of the plurality of depressed portions; and performing a drying process on the second planarization sub-film to form the second planarization sub-layer, the second planarization sub-film comprising a material forming the second planarization sub-layer and a solvent.

4. The method of fabricating the substrate according to claim 3, wherein a thickness of the second planarization sub-film is greater than a depth of each of the at least multiple depressed portions of the plurality of depressed portions.

5. The method of fabricating the substrate according to claim 3, wherein after forming the first planarization sub-layer and before forming the second planarization sub-layer at the at least multiple depressed portions of the plurality of depressed portions, the method further comprises:

determining a thickness of a portion of the second planarization sub-film to be filled into each of the at least multiple depressed portions of the plurality of depressed portion according to depths of at least two of the at least multiple depressed portions and a shrinkage ratio of the second planarization sub-film.

6. The method of fabricating the substrate according to claim 3, wherein forming the second planarization sub-film at the at least multiple depressed portions of the plurality of depressed portions comprises:

printing the second planarization sub-film at the at least multiple depressed portions of the plurality of depressed portions.

7. The method of fabricating the substrate according to claim 1, wherein a material of the first planarization sub-layer is the same as a material of the second planarization sub-layer.

8. The method of fabricating the substrate according to claim 1, wherein the substrate has a display area and a non-display area; and forming the second planarization sub-layer at the at least multiple depressed portions of the plurality of depressed portions comprises forming the second planarization sub-layer at some of the plurality of depressed portions located in the display area of the substrate.

9. A substrate, which is fabricated according to the method of claim 1, comprising:

a base substrate;

a patterned film layer disposed on the base substrate; and a planarization layer disposed on the patterned film layer, wherein the planarization layer comprises a first planarization sub-layer and a second planarization sub-layer, a surface of the first planarization sub-layer facing away from the base substrate has a plurality of depressed portions, and the second planarization sub-layer is disposed at at least multiple of the plurality of depressed portions; and a flatness of a surface of the planarization layer is higher than a flatness of the surface of the first planarization sub-layer facing away from the base substrate.

10. The substrate according to claim 9, wherein a material of the first planarization sub-layer is the same as a material of the second planarization sub-layer.

11. The substrate according to claim 9, wherein the patterned film layer comprises a plurality of thin film transistors.

12. The substrate according to claim 9, further comprising a plurality of light- emitting devices sequentially disposed on the planarization layer, each light-emitting device comprising a first electrode, a light-emitting functional layer, and a second electrode.

13. A display panel, comprising the substrate according to claim 9.

14. A display device, comprising the display panel according to claim 13.

* * * * *